United States Patent [19]

Mioduski

[11] 4,031,504

[45] June 21, 1977

[54] GAIN RANGING AMPLIFIER SYSTEM

[75] Inventor: George T. Mioduski, Houston, Tex.

[73] Assignee: Western Geophysical Company of America, Houston, Tex.

[22] Filed: Mar. 8, 1976

[21] Appl. No.: 664,616

[52] U.S. Cl. .......................... 340/15.5 GC; 330/29; 330/86; 330/144

[51] Int. Cl.² ..................................... G01V 1/24

[58] Field of Search ............... 340/15.5 GC; 330/29, 330/86, 51, 144

[56] References Cited

UNITED STATES PATENTS

| | | | |
|---|---|---|---|
| 3,308,392 | 3/1967 | McCarter | 340/15.5 GC |
| 3,636,463 | 1/1972 | Ongkiehong | 330/29 |
| 3,688,250 | 8/1972 | Howlett | 340/15.5 GC |
| 3,813,609 | 5/1974 | Wilkes et al. | 340/15.5 GC |
| 3,919,657 | 11/1975 | Howlett et al. | 340/15.5 GC |
| 3,919,685 | 11/1975 | Haill | 340/15.5 GC |
| 3,988,689 | 10/1976 | Ochi et al. | 330/51 |

*Primary Examiner*—Howard A. Birmiel
*Attorney, Agent, or Firm*—William A. Knox

[57] ABSTRACT

The compression portion of an instantaneous companding (compressing-expanding) system includes at least two and preferably four "bi-gain" amplifiers connected in cascade. Each bi-gain amplifier normally has a low-gain state and can be switched to a discrete high-gain state. A discrete reference voltage is provided to compare with the output of each amplifier. The amplifiers are initially switched to their low-gain states and the reference voltage corresponding to the first amplifier is selected. A comparator means makes a comparison between the system's output voltage and the selected reference voltage. The control means switches the first amplifier to its high-gain state or holds it in the low-gain state depending on the result of the comparison. By utilizing a different variable reference voltage and bi-gain amplifiers with two different amplification factors, the number of amplifiers and comparisons is significantly reduced. Noise-cancelling means are also associated with each amplifier to remove undesired DC noise signals from each amplifier.

13 Claims, 4 Drawing Figures

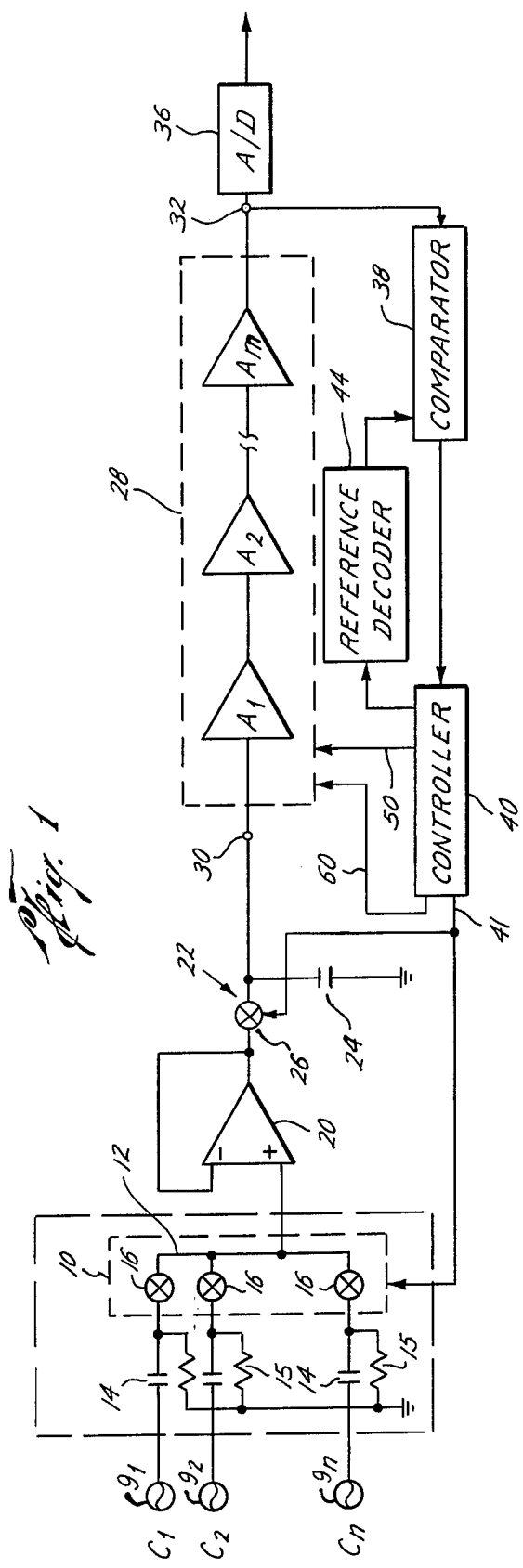
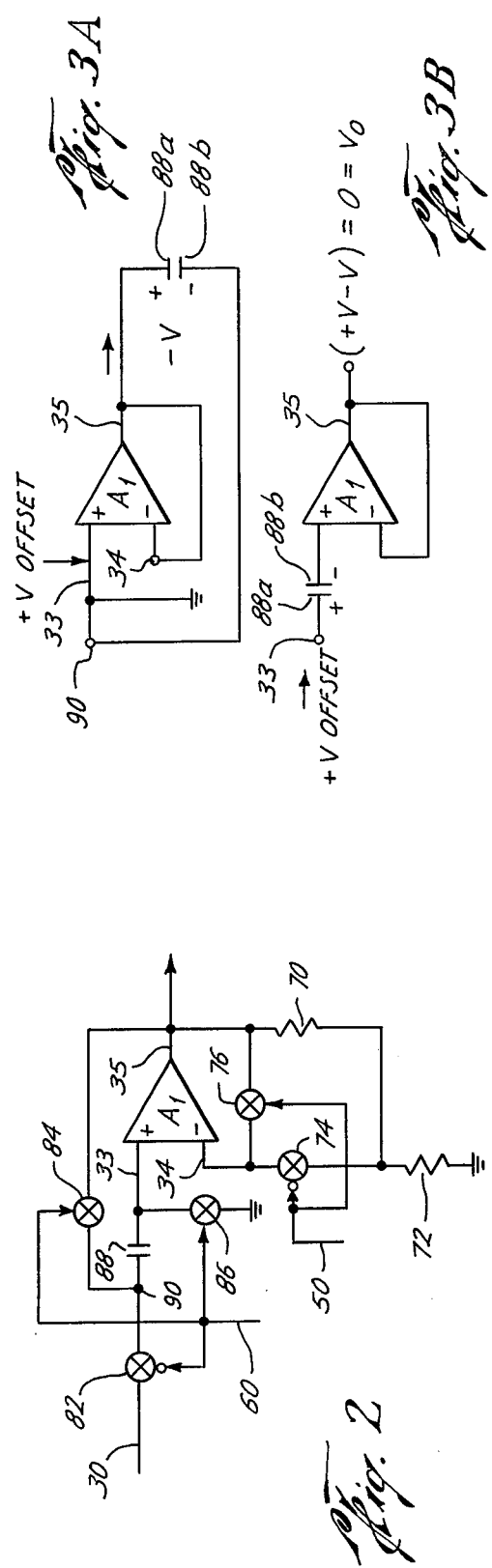

GAIN RANGING AMPLIFIER SYSTEM

BACKGROUND OF THE INVENTION

Reference to Related Applications

This application forms part of a group of patent applications filed concurrently, having the following attorney's docket numbers, serial number, titles and inventors:

| W.G. | 229 | SEISMIC METHOD AND SYSTEM OF IMPROVED RESOLUTION AND DISCRIMINATION - C. H. Savit. Serial No. 665,150 |
|---|---|---|
| LRS | 120 | MULTIPLEXER-COMMUTATED HIGH PASS FILTER - Lee E. Siems, Serial No. 664,614 |
| LRS | 123 | SEISMIC DATA TELEMETER SYSTEM - Lee E. Siems, Paul M. Morgan. Serial No. 665,151 |
| LRS | 124 | DECENTRALIZED SEISMIC DATA PROCESSING SYSTEM - Lee E. Siems et al. Serial No. 664,618 |
| LRS | 126 | MULTIPLEXER OFFSET REMOVAL CIRCUIT - Lee E. Siems. Serial No. 664,615 |
| LRS | 127 | MULTICHANNEL SEISMIC TELEMETER SYSTEM AND ARRAY FORMER - Lee E. Siems et al. Serial No. 664,617 |

Field of the Invention

The invention generally relates to gain-ranging amplifier systems and more particularly to binary gain-ranging amplifier systems such as are employed, for example, in digital seismic systems.

Reference to Related Art

In multi-channel analog-digital data acquisition systems, the signals are first multiplexed or sampled and then converted into digital numbers corresponding to the sampled signal amplitudes. When these amplitudes have a very wide dynamic range, say between 0 and 90 dB, it is desirable to first pass the sampled analog signals through a binary gain-ranging amplifier system prior to converting them into digital numbers. In this fashion, the amplified output signals will fall within a limited range thus enhancing the signal to noise ratio.

A widely employed binary gain-ranging system includes a plurality of fixed-gain amplifiers whose outputs can be selectively connected to a common bus by a system controller. A comparator makes a comparison between the amplitude of the output signal from the common bus and a single reference voltage. If the output signal is smaller than the reference voltage, then the comparator will cause the controller to insert into the system an additional amplifier. The process is repeated until the output signal from the common bus becomes greater than the single reference voltage. The gain of a number of cascaded amplifiers can be expressed in digital form to any particular base, typically 2. For example, if the gain is to range in incremental gain steps having a ratio of 2:1 from $2^0$ to $2^{15}$, sixteen gain decisions and fifteen amplifiers are required. The drawbacks of such a binary gain-ranging system stem primarily from the relatively large number of required fixed-gain amplifiers. Also, the comparator must be adapted to make sixteen decisions based on sixteen comparisons and the controller must be adapted to execute these sixteen decisions.

In such a system the total time required to select the proper gain in order to amplify each sampled analog signal, including the time required by the amplifiers to settle to their steady states, is relatively large and wasteful of expensive data processing time. Additionally, the large number of required amplifiers and associated hardware would require a larger volume than is generally available in miniaturized systems. Furthermore, since signals having different amplitudes must pass through different numbers of amplifiers, differences in amplifier characteristics of the various amplifiers adversely affect the output signals.

Accordingly, the main objects of the present invention are to reduce the number of required amplifiers and to reduce the size of conventional gain-ranging amplifier systems.

It is a further object of the present invention to provide a new and improved binary gain-ranging system which is especially adapted for use in confined areas, for example within a seismic streamer cable having an outside diameter of a few inches.

SUMMARY OF THE INVENTION

The gain-ranging amplifier system comprises at least two and preferably four bi-gain amplifiers connected in cascade between an input terminal and an output terminal. Each amplifier normally has a low-gain state and can be switched by a controller to a high-gain state. Voltage reference means selectively provide a discrete reference voltage to correspond with each amplifier. A comparator makes a comparison between the system's output voltage and the selected reference voltage. If the comparison shows that the reference voltage is greater than the output voltage, the controller adjusts the first amplifier to its high-gain state. Thereafter, the comparator makes a second comparison between the system's output voltage and the reference voltage which corresponds to the second amplifier. Again, if the comparison indicates that the reference voltage is greater than the output voltage, the controller will adjust the second amplifier to its high-gain state. This process will be repeated until the comparison indicates the the system's output voltage is greater than the reference voltage corresponding to a particular amplifier, or until all of the amplifiers have been adjusted to their high-gain states. Thus, the overall gain of the system is adjustable in incremental steps from a low-gain value, preferably unity, for large-amplitude incoming signals, to a high-gain value for small-amplitude incoming signals. By this means, no amplifier is in danger of being overdriven.

In a further embodiment of the invention arrangements are provided for automatically cancelling DC or very low frequency noise signals that may be present at the input terminals to each amplifier as a result of the individual amplifier characteristics. The noise-cancelling circuit includes a capacitor and switch connected between the input-output circuit of each amplifier for periodically isolating the amplifier and charging the capacitor with the self-generated amplifier noise. The charge on the capacitor will have an amplitude and polarity equal and opposite to the self-generated noise such as to substantially cancel the DC noise signals appearing on the input terminals to each amplifier.

A distinct advantage of the disclosed system stems from the fact that all four amplifiers are always connected in the circuit. The above fact being true, there is no danger of differential distortion at different signal levels as was true of the prior art.

BRIEF DESCRIPTION OF THE DRAWINGS

For a better understanding of this invention reference may now be made to the accompanying drawings and detailed description wherein:

FIG. 1 is a block diagram representation of an improved binary gain ranging system of the invention;

FIG. 2 is a schematic diagram of an amplifier with noise-cancelling means; and

FIGS. 3A and 3B are schematic representations of the noise-cancelling principle.

DETAILED DESCRIPTION OF A PREFERRED EMBODIMENT

An analog to digital acquisition system includes a multiplexer 10 having a plurality of signal input channels $C_1, C_2, \ldots, C_n$ all connected to a bus 12 through DC blocking capacitor 14, resistors 15, and switches 16. Each resistor 15 in combination with its capacitor 14 forms a high-pass RC filter for its channel. Switches 16 are high-speed FET switches of any well known type. Seismic sensors $9_1, 9_2, 9_n$ may provide the source signals for the system.

The output of multiplexer bus 12 is typically connected to the non-inverting input of a unity-gain buffer amplifier 20 that may be an operational amplifier such as an LF 356, made by National Semiconductor, Inc. The output of buffer amplifier 20 is connected to a sample-and-hold circuit 22 having a series capacitor 24 and a shunt switch 26. The output of circuit 22 is coupled to the gain-ranging system 28 of this invention.

The gain-ranging amplifier system 28 has an input terminal 30 and and output terminal 32 and basically consists of at least two and preferably four bi-gain amplifiers $A_1, A_2, \ldots, A_m$ connected in cascade. Each amplifier would typically include a pair of input terminals 33, 34 and an output terminal 35 (FIG. 2). The non-inverting input 33 to the first amplifier $A_1$ is coupled to the input terminal 30 which receives the output signal of the sample-and-hold circuit 22. The output voltage of the last amplifier $A_m$ on output terminal 32 is applied to a signal utilization device such as an analog-to-digital (A/D) converter 36 as well as to a window comparator 38 (FIG. 1). The gain of each amplifier may be set or adjusted to one of two states, a low-gain state, preferably equal to unity, or to a high-gain state $G_i$, where $G_i$ is a discrete high-gain value for the ith (i = 1, 2, ... ,m) amplifier.

A state controller 40 is interconnected with switches 16, 26, through a control bus 41 having a plurality of control lines. Controller 40 sequences the signal input channels $C_1$-$C_n$ through a multiplexer scan cycle.

Associated with state controller 40 are a variable reference decoder 44 and the window comparator 38. Gain-control lines 50 and noise-cancelling control lines 60 interconnect state controller 40 with each one of the amplifiers $A_1$-$A_m$. For simplicity, only one gain-control line 50 and one noise-cancelling control line 60 are shown in FIG. 1, but it should be understood that there will be as many such control lines as there are amplifiers.

In a preferred embodiment, state controller 40 is a synchronous programmable counter such as a 74S161 integrated circuit made by Texas Instruments. Reference decoder 44 is a digital-to-analog converter (DAC) such as MC 1408L made by Motorola. Comparator 38 may be a LM 311 voltage comparator, and each one of amplifiers $A_1$-$A_m$ is a high input impedance operational amplifier such as LF 156 both devices being made by National Semiconductors, Inc.

Each one of the amplifiers $A_1$-$A_m$ has a gain-control circuit and a noise-cancelling circuit, both shown in detail in FIG. 2. The control circuit includes a voltage divider network formed by resistors 70, 72, FET switches 74, 76, and a gain-control line 50. In the gain-setting operation, when switch 76 is closed and switch 74 is open, the amplifier's output signal is fed back from output 35 to the inverting input 34, thereby setting the amplifier to its low-gain state which is equal to one. When switch 74 is closed and switch 76 is open, the amplifier is set to its high-gain state $G_1$ since resistor 70 is now in the amplifier's feedback loop. The desired gain state is set in response to a control signal from controller 40 through a control line 50.

The noise-cancelling circuit comprises FET switches 82, 84, 86, a capacitor 88, and a noise-cancelling control line 60. When switch 82 is closed, switches 84 and 86 will open.

In the noise or offset removal mode by means of which the characteristics of each amplifier are corrected, controller 40 sends a signal through a control line 50, to close switch 76 and open switch 74, thereby setting each amplifier to unity gain-state. Simultaneously, controller 40 disconnects the input terminal 30 to system 28 by opening switch 82 and establishes connection, by closing switch 84 (FIG. 2 and 3A), between junction 90 and the output terminal 35 of the amplifier. Input terminal 33 to the amplifier is grounded by closing switch 86. Switches 82, 84 and 86 are actuated by a signal arriving on a control line 60. Any DC noise ("offset") will now appear on the amplifier's output terminal 35. Capacitor 88 will become charged with the polarities across its plates 88a, 88b as shown for an offset voltage +V appearing on input terminal 33 (FIG. 3B). When the offset removal mode has been completed, controller 40 will close switch 82 and open switches 84 and 86 by means of a second signal through control lines 60, thus reconnecting the input terminal 30 with the amplifier system 28 and restoring the amplifiers to their normal operating mode.

The charge voltage +V across capacitor 88 will now be algebraically added to the incoming signal $V_{in}$, and will substantially completely cancel the amplifier's inherent offset signal +V as demonstrated in FIG. 3B. The amplifier's output signal will therefore become free of DC noise regardless of the gain to which the amplifier may have been set. The factors which determine how often it is necessary to go into the offset-removal mode will depend on the rate the offset noise drifts and on the value of the amplifier's input impedance.

In the gain-ranging operation, the gain-determination cycle for each channel (such as channel $C_1$) starts with all of the amplifiers set to unity gain. State controller 40 provides a sequence of digital codes representing a corresponding sequency of variable reference voltage steps. The digital codes are converted to corresponding discrete reference voltages $V_R$ by reference decoder 44. The reference voltages can be stepped through the sequence $$V_{R1} = V_B/G_1, V_{R2} = V_B/G_2, \ldots, V_{Rm} = V_B/G_m$$

where $G_1, G_2, \ldots, G_m$ are the higher gain values of amplifiers $A_1, A_2, \ldots, A_m$, respectively, and $V_B$ is a base voltage equal to a preselected fraction of the full-scale voltages of A/D converter 36. The gains $G_i$ are proportional to a preselected power of some number base, say two; the preselected power is unique for each amplifier. The variable reference voltage steps $V_{Ri}$ are inversely proportional to the unique gain values of their corresponding amplifiers. It may be noted in passing that the controller 40 includes as part of both offset removal mode and the gain ranging mode, the setting of the amplifier to their unity gain state. This common step simplifies the implementation of these functions.

In a preferred embodiment, $G_i = 2 \exp 2^{(m-i)}$. For an amplifier system 28 comprising four amplifiers ($m = 4$), the respective high-gain values for the amplifiers would be: $G_1 = 256, G_2 = 16, G_3 = 4, G_4 = 2$. With only four high-gain settings, the overall gain of the binary amplifier system 28 can be made to range from 2 to the zeroth power (i.e. one) to 2 to the 15th power (i.e. 32,768) in steps of powers of 2. To accomplish the above, only four gain decisions need to be made. The gain comparisons must be made using the amplifier having the highest gain setting first, and thereafter the comparisons are made in order of descending amplifier gain, regardless of the electrical position of the particular amplifier in the cascade.

The gain-ranging operation will now be explained in greater detail. With all four amplifiers set to unity gain, the absolute value of the system's output voltage $|V_O|$ appearing on output terminal 32 is compared with the first reference voltage $V_{R1} = V_B/256$ by comparator 38. Comparator 38 rectifies $V_O$ and compares its absolute value with reference voltage $V_{R1}$. The decision based on this comparison is applied to controller 40. If $|V_O| \geq V_{R1}$ controller 40 causes the gain of amplifier $A_1$ to remain at unity gain. If $|V_O| < V_{R1}$ controller 40 sets the gain of amplifier $A_1$ to $G_1$ or 256. The variable reference voltages $V_{R2}, V_{R3}, V_{R4}$, are then sequentially compared with the successive values of $|V_O|$ that appear after the sequential switching decisions are made. As each comparison is made, a gain decision is also made by controller 40 for the amplifier having the next successive lower gain corresponding to the reference voltage used for the comparison.

In sum, the comparator 38 compares the output signal $|V_O|$ on terminal 32 with reference voltage $V_{R1}$ corresponding to amplifier $A_1$. When the comparison is negative, that is, when the absolute value of $V_O$ is less than $V_{R1}$, then comparator 38 will instruct controller 40 to open the normally-closed switch 76 and close the normally-open switch 74 (FIG. 2). Amplifier $A_1$ is now at its high-gain setting. The sampled signal held by the sample-and-hold circuit 22 is again amplified by the binary gain ranging system 28, with amplifier $A_1$ adjusted to its high-gain setting and the remaining amplifiers $A_2$-$A_4$ remaining at their unity gain settings. If the new value $|V_O| < V_{R2}$, i.e., if the result of the second comparison is again negative then comparator 38 will instruct the controller 40 to set amplifier $A_2$ to its high-gain setting. The sampled signal will again be amplified by the binary gain-ranging system 28 having amplifiers $A_1$ and $A_2$ at their high-gain settings and amplifiers $A_3$, $A_4$ at their unity gain settings. If the next value $|V_O| < V_{R3}$, i.e., if the result of the third comparison is again negative, controller 40 will cause amplifier $A_3$ to assume its high-gain setting. If after the fourth comparison $|V_O| < V_{R4}$, then controller 40 will cause amplifier $A_4$ to assume its high-gain setting but if $|V_O| \geq V_{R4}$, controller 40 will hold the amplifier at unity gain. After completion of the fourth comparison, comparator 38 will instruct controller 40 to cause the A/D converter 36 to accept the voltage $V_O$ that now appears and to convert it into a digital number.

After the completion of each gain-selection sequence, the overall gain of the cascade of four amplifiers is encoded by controller 40 as a digital gain-code word which will include as many bits as there are amplifiers in amplifier system 28. Each bit of the gain-code word represents the state of switch 76. The gain-code is ONE if switch 76 is open, it is ZERO if it is closed. Thus, in the case of four amplifiers, if all of the amplifiers are set to unity gain, the gain code will be 0000. If the overall gain is 64, the gain code will be 0110.

Thus with four amplifiers, requiring only four decisions, the binary gain-ranging system 28 of the present invention will provide $2^{15}$ gain steps, a job which previously required fifteen amplifiers and sixteen distinct decisions and executions. Hence the binary gain-ranging system 28 of the present invention can accomplish the job of selecting a suitable gain for the amplifier system 28 in a fraction of the time previously required by the known systems. System 28 will occupy a fraction of the volume previously needed to house a conventional binary gain-ranging amplifier.

In the foregoing specification, one illustrative embodiment of the invention has been described. It is to be understood, however, that minor modifications and departures from the specific structure and circuitry are within the scope of the present specification. By way of example but not by way of limitation, the gain states of the amplifiers could be based on a ternary, octal or decimal number base instead of binary.

What is claimed is:

1. A gain-ranging amplifier system having an input terminal and an output terminal, and a ground;
   a plurality of bi-gain amplifiers connected in cascade between said terminals, each amplifier normally having a low-gain state and a high-gain state, the ratio of the amplification in the two states being different in different amplifiers;
   voltage reference means selectively providing a discrete reference voltage to correspond with each amplifier, the amplifier with the highest gain having the lowest reference voltage;
   a controller including means for selecting a first amplifier having the highest gain and selecting a first reference voltage corresponding thereto;
   means for comparing the system's output voltage received from said output terminal with said first reference voltage; and
   means for applying the output from said comparing means to said controller.

2. The system of claim 1 further including circuitry for switching said first bi-gain amplifier to its high-gain state when said comparison is negative.

3. The system of claim 2 wherein additional means are provided for switching a second of said plurality of bi-gain amplifiers to a selected state following a comparison with a second discrete reference voltage appertaining to said second amplifier.

4. The system of claim 3 wherein additional means are provided for switching successive ones of said plurality of bi-gain amplifiers to a selected state following a comparison with successive additional discrete reference voltages appertaining to said successive amplifiers.

5. The system of claim 1 wherein the ratio of the gain of each of said amplifiers in the high gain state relative to the low gain state is equal to a constant raised to a power which is exponentially increased for successive amplifiers.

6. The system of claim 5 wherein the high gain value of each amplifier is given by the following formula: $G_i = 2 \exp 2^{(m-i)}$, where $G_i$ is the high gain value of the ith amplifier $m$ is the number of amplifiers and $i$ is an integer corresponding to the amplifier whose gain is being determined.

7. The gain-ranging amplifier system of claim 1 wherein each one of said amplifiers is an operational amplifier having a non-inverting input terminal, an inverting input terminal, and an amplifier output terminal;
a first switch connected between said inverting input terminal and said amplifier output terminal;
a pair of series connected resistors connected between said amplifier output terminal and said ground;
a second switch connected between said inverting input terminal and the junction between said resistors;
said first switch being normally closed whereby said amplifier has unity gain; and
said controller being connected to said first and second switches for opening said first switch and closing said second switch thereby causing said amplifier to assume a high-gain state greater than one.

8. The amplifier system of claim 7 and further includings:
a capacitor connected between said non-inverting terminal and one terminal of a third switch, the other terminal of said third switch being connected to said amplifier output terminal;
a fourth switch connected between said non-inverting terminal and said ground;
a fifth switch connected to said one terminal of said third switch; and
control lines coupled between said controller and said third, fourth and fifth switches for opening said fifth switch and closing said third and fourth switches, thereby charging said capacitor to the offset voltage of said amplifier, and for closing said fifth switch and opening said third and fourth switches, thereby automatically cancelling the offset voltage from the output of said amplifier.

9. The gain-ranging amplifier system of claim 1 wherein the amplification of said amplifiers in their low gain states is equal to unity.

10. The gain-ranging amplifier system of claim 1 wherein said voltage reference means is a reference decoder.

11. A variable gain amplifier system for use with a seismic signal source comprising:
a plurality of cascaded bi-gain amplifiers, each having a high impedance input and an output, the input of the first amplifier being connected to said signal source to receive an input signal $V_{in}$ and the output of the last amplifier providing a system output voltage $V_o$, each of said amplifiers being characterized by first and second gain states, the amplifier gain being unity in the first state and $G_1$ in the second state, $G_i$ being a discrete gain value characteristic of the ith amplifier $A_i$;
means to provide a sequence of discrete reference voltage levels $V_{Ri}$, said voltage levels being equal to $V_B/G_i$, $V_B$ being a preselected base voltage;
first control means to set all of the plurality of cascaded amplifiers to unity gain;
means to compare sequentially the absolute value of the output voltage $V_o$ with each of said discrete reference voltage levels $V_{Ri}$; and
means to change the gain state of the ith amplifier from unity gain to the second gain state when $V_o$ is less than $V_{Ri}$ and to hold said ith amplifier at unity gain when $V_o$ is equal to or greater than $V_{Ri}$.

12. A gain ranging amplifier system having input and output terminals comprising:
a plurality of amplifiers having inputs and outputs connected in cascade between said terminals, each said amplifier having at least two different gain states, one gain state being unity, the amplification ratio between said gain states being unique to each said amplifier;
controller means for defining the gain states of said amplifiers;
voltage reference means for selectively providing discrete reference voltages corresponding to the amplification ratios unique to each said amplifier, the amplifier having the highest amplification ratio being associated with the lowest reference voltage;
means for comparing the signal voltage at the output of said system with said first reference voltage; and
means for transmitting the result of the comparison to the controller.

13. The system as defined by claim 12 including:
capacitor means coupled in series with said amplifier inputs for receiving a noise voltage
means for switching all of said amplifiers to the unity gain state; and
feedback loop means for switchably coupling said amplifier outputs to said capacitor means whereby the output noise voltage is stored in said capacitor means with reverse polarity.

* * * * *